United States Patent
Byeon

(10) Patent No.: US 7,957,201 B2
(45) Date of Patent: *Jun. 7, 2011

(54) FLASH MEMORY DEVICE OPERATING AT MULTIPLE SPEEDS

(75) Inventor: Dae-Seok Byeon, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/854,987

(22) Filed: Aug. 12, 2010

(65) Prior Publication Data

US 2010/0302869 A1    Dec. 2, 2010

Related U.S. Application Data

(63) Continuation of application No. 11/853,958, filed on Sep. 12, 2007.

(30) Foreign Application Priority Data

Oct. 20, 2006   (KR) .................. 10-2006-0102404

(51) Int. Cl.
*G11C 11/34*  (2006.01)
*G11C 16/06*  (2006.01)

(52) U.S. Cl. ......... 365/185.25; 365/185.18; 365/185.19; 365/185.23; 365/185.28; 365/185.33; 365/185.11; 365/185.12; 365/185.01; 365/189.04; 365/189.11; 365/230.02; 365/230.03; 365/194; 365/203

(58) Field of Classification Search ............. 365/185.18, 365/185.25, 203, 185.19, 185.23, 185.28, 365/185.33, 185.11, 185.12, 185.01, 189.04, 189.11, 194, 230.02, 230.03

See application file for complete search history.

(56) References Cited

U.S. PATENT DOCUMENTS

| | | | |
|---|---|---|---|
| 6,438,032 B1 | 8/2002 | Pekny et al. | |
| 6,724,682 B2 * | 4/2004 | Lee et al. | 365/230.06 |
| 6,950,346 B2 | 9/2005 | You | |
| 7,085,189 B2 * | 8/2006 | Horii et al. | 365/230.03 |
| 7,224,617 B2 | 5/2007 | Takeuchi | |

FOREIGN PATENT DOCUMENTS

| | | |
|---|---|---|
| KR | 1019970051186 A | 7/1997 |
| KR | 19990075960 B1 | 10/1999 |
| KR | 1020040021773 A | 3/2004 |

OTHER PUBLICATIONS

U.S. Appl. No. 11/853,958.*

* cited by examiner

*Primary Examiner* — Huan Hoang
*Assistant Examiner* — Kretelia Graham
(74) *Attorney, Agent, or Firm* — Volentine & Whitt, PLLC

(57) ABSTRACT

A method of operating a flash memory device includes a first operating mode and a second operating mode having different operating speeds. Each one of the first and second operating modes includes a bit line set-up interval and at least one additional interval. The flash memory is divided into first and second mats connected to respective first and second R/W circuits. During the bit line set-up interval of the second operating mode, the flash memory controls operation of both the first and second R/W circuits in a time division approach to stagger respective peak current intervals for the first and second mats.

7 Claims, 6 Drawing Sheets

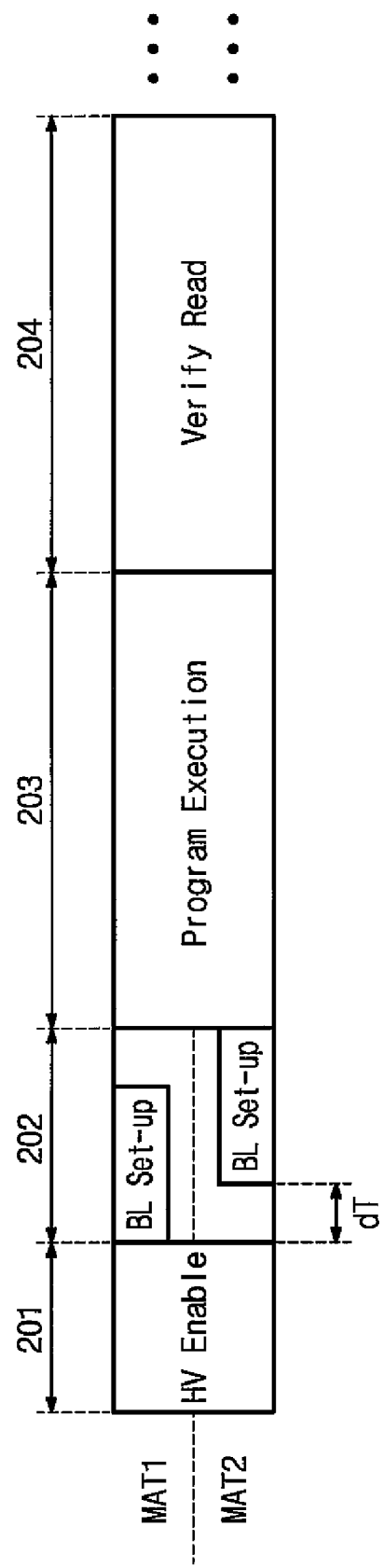

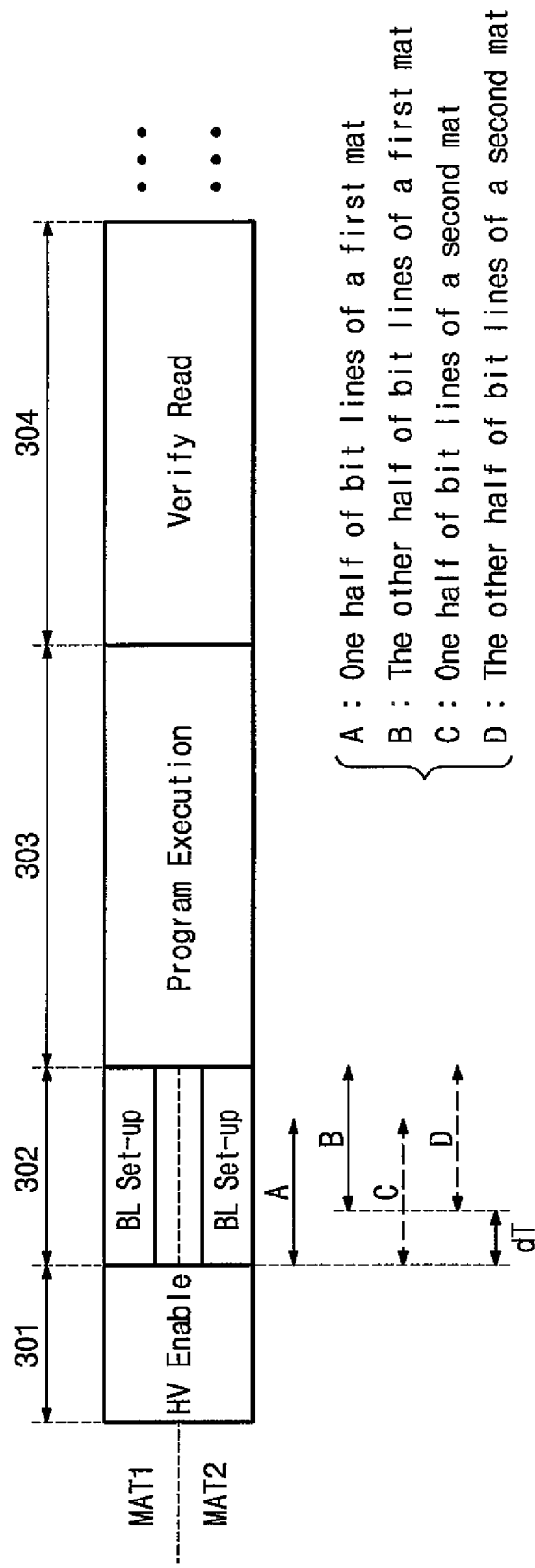

FLASH MEMORY DEVICE OPERATING AT MULTIPLE SPEEDS

CROSS-REFERENCE TO RELATED APPLICATIONS

This application is a continuation of U.S. patent application Ser. No. 11/853,958 filed on Sep. 12, 2007, which claims priority under 35 U.S.C §119 to Korean Patent Application 10-2006-0102404 filed on Oct. 20, 2006 The subject matter of both of these applications is hereby incorporated by reference.

BACKGROUND OF THE INVENTION

1. Field of the Invention

The present invention relates to flash memory. More particularly, the invention relates to a flash memory device capable of operating at multiple speeds.

2. Description of the Related Art

Flash memory is one type of commonly used nonvolatile memory. Nonvolatile memory is distinguished from volatile memory (e.g., Dynamic Random Access Memory (DRAM) and Static Random Access Memory (SRAM)) in its ability to retain stored data in the absence of applied electrical power. As conventionally available, flash memory may be classified into NOR flash memory and NAND flash memory.

FIG. 1 is a block diagram illustrating a portion of an array structure for a conventional flash memory device.

Referring to FIG. 1, a conventional flash memory device includes a memory cell array comprising a plurality of memory blocks (BLK0 through BLKn−1) and a plurality of bit lines (BLei and BLoi, where "i" varies from 0 to m−1). A collection of page buffers is associated with odd and even pairs of bit lines (e.g., BLe0 and BLo0). Each page buffer may be configured to select one or both of the corresponding pair of bit lines. For example, during a bit line setup interval of a program operation, each page buffer may be configured to drive its corresponding pair of bit lines with a pre-charge voltage. Subsequently, each page buffer may be configured to drive either one of its corresponding pair of bit lines with a program voltage (e.g., a ground voltage) or a program-inhibit voltage (e.g., a power supply voltage).

FIG. 2 is a circuit diagram showing a portion of the bit line and memory block arrangement identified by the dotted line shown in FIG. 1.

Referring to FIG. 2, paired bit lines BLe0 and BLo0 are respectively connected in strings of memory cells (MC). Each string includes a string select transistor (SST) having its source connected to a corresponding bit line, a ground select transistor (GST) having its source connected to a common source line CSL. The memory cells, or more particularly the transistors associated with the memory cells (MC31 through MC0), are connected in series between the source of the string select transistor (SST) and the drain of the ground select transistor (GST).

In the foregoing configuration, operation of the string select transistor (SST) is controlled by a voltage applied to a string select line (SSL), and operation of the ground select transistor (GST) is controlled by a voltage applied to a ground select line (GSL). Operation of the memory cells (MC31 to MC0) is controlled by a voltage applied through a corresponding word line (WL31 to WL0). In FIG. 2, one of the bit lines BLe0 and BLo0 may be driven with a program voltage or a program-inhibit voltage by a corresponding page buffer. During such operation, and as is well known in the art, the non-driven bit line in the paired bit lines operates as a shield line. Before being driven with the program or program-inhibit voltage, however, both of the paired bit lines BLe0 and BLo0 may be simultaneously pre-charged with a pre-charge voltage via the corresponding page buffer.

FIG. 3 is a diagram illustrating nominal power consumption as a function of program operation internal within a conventional flash memory device, such as the one illustrated in FIG. 1.

As is well understood in the art, the program operation illustrated in FIG. 3 includes a high-voltage enable interval 10, a bit line setup interval 11, a program execution interval 12, and a verify read interval 13. During the high-voltage enable interval 10, a high voltage required for the program execution interval 12 is generated. In the bit line setup interval 11, both bit lines (BLei and BLoi) are pre-charged by a corresponding page buffer, and then one of the paired bit lines is driven with a program voltage or a program-inhibit voltage via the corresponding page buffer. During the program execution interval 12, a selected word line is driven with a program voltage while unselected word lines are driven with a pass voltage. During the verify read interval 13, a determination is made as to whether the memory cells connected to the selected word line (i.e., the memory cells in the selected page) have been properly programmed (i.e., "programmed normally"). One sequential pass through the foregoing intervals 11 to 13 constitutes "a program loop", or "a unit loop", which may be repeated until memory cells in the selected page are programmed normally.

As depicted in FIG. 3, the program operation draws the greatest operating current, and thereby consumes the most power, during the bit line setup interval 11. This result arises from the fact that both of the paired bit lines (BLei and BLoi) are simultaneously pre-charged with the pre-charge voltage. A peak current drain is indicated in FIG. 3 by the level "Imax". Of note in this regard, the peak amount of current drawn during the bit line setup interval 11 may be limited not to exceed some defined critical limit. Such a critical limit may be defined in relation to any number of system requirements or tolerances within a flash memory device.

For example, in an exemplary case where a flash memory device is characterized by a 2 KByte page depth and an even/odd bit line configuration, a peak current limit (Imax) may arise when 2 KB*2 (4 KB) bit lines are simultaneously pre-charged with a power supply voltage (VCC) during a bit line setup interval. Under these assumptions, the peak current limit (Imax) may reach 60 to 120 mA. This peak current limit may preclude (or greatly inhibit) the use of multiple operating speeds within a flash memory device supporting selectively enabled modes characterized by different operating speeds. In such devices, peak current consumption may exceed a defined peak current limit in one operating mode during its bit line setup interval.

One conventional example of a flash memory device supporting selectively enabled operating modes having different operating speeds is disclosed in U.S. Pat. No. 6,724,682, the subject matter of which is hereby incorporated by reference. In this conventional example, a flash memory device is disclosed having both single and double speed operating modes. Continuing forward with the assumptions stated above, a flash memory device with a single speed operating mode performs a read or program operation in relation to a 2 KB unit, and therefore simultaneously drives 2 KB bit lines. (As will be appreciated by those of ordinary skill in the art, this unit size may alternately be configured (e.g.,) as 512 B, 1 KB, etc.). Thus, in a case where each page buffer is connected to a pair of even and odd bit lines, and although the flash memory device is running in a single speed operating mode, 4 KB (2 KB*2) bit lines must be simultaneously driven.

Where this type of flash memory device is embedded in a portable or mobile host device, the capabilities of the supporting host device battery must be considered, along with other flash memory related system considerations. For example, the effect of simultaneously driving (pre-charging) paired bit lines must be considered. Yet, the possible provision of single and double speed operating modes must also be considered. That is, battery capabilities, peak current limit definition, and global programming intervals must be carefully balanced to allow multiple speed operating modes, such that peak current demanded by one operating mode does not exceed allowable critical limits and/or battery capabilities.

SUMMARY OF THE INVENTION

In one embodiment, the invention provides a method of operating a flash memory device in a first operating mode and a second operating mode having different operating speeds, wherein each one of the first and second operating modes comprises a bit line set-up interval and at least one additional interval, wherein the flash memory is divided into first and second mats connected to respective first and second read/write (R/W) circuits and the method comprises; during the bit line set-up interval of the second operating mode, controlling operation of both the first and second R/W circuits in a time division approach to stagger respective peak current intervals for the first and second mats.

In another embodiment, the invention provides a flash memory device capable of running in a single speed operating mode and a double speed operating mode, and comprising; a memory cell array comprising a plurality of bit lines associated with a first mat and a second mat, first and second read/write (R/W) circuits respectively performing an operation with respect to the first and second mats, wherein the operation comprises a bit line set-up interval during which a precharge operation is performed and at least one additional interval, and a controller controlling operation of the first and second R/W circuits during the double speed operating mode, such that during the bit line set-up interval, the precharge operation is carried out in a time division approach with respect to the first and second mats.

In another embodiment, the invention provides a flash memory device capable of performing an operation in a single speed operating mode and a double speed operating mode, wherein the operation comprises a bit line set-up interval during which a precharge operation is performed and at least one additional interval, the flash memory device comprising; a memory cell array comprising a plurality of bit lines divided into a first mat and a second mat, a first read/write (R/W) circuit performing an operation with respect to the first mat and a second R/W circuit performing the operation with respect to the second mat, and a controller controlling operation of the first and second R/W circuits during the double speed operating mode such that during the bit line set-up interval the precharge operation is carried out in a time division approach with respect to the first and second mats, and during the single speed operating mode such that during the bit line set-up interval the precharge operation is carried simultaneously with respect to the first and second mats.

BRIEF DESCRIPTION OF THE DRAWINGS

FIGS. 5 and 6 are diagrams further describing multiple speed operating modes for a flash memory device according to an embodiment of the invention.

DESCRIPTION OF EMBODIMENTS

Figure 1:
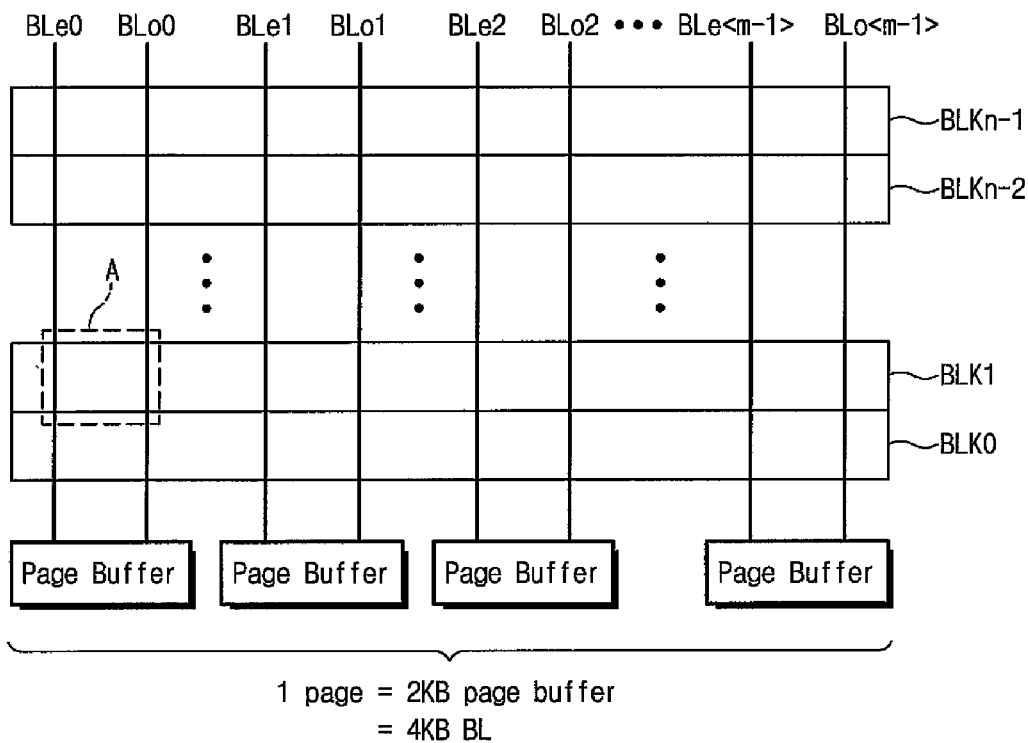
FIG. 1 is a block diagram showing an array structure of a conventional flash memory device.
Figure 2:
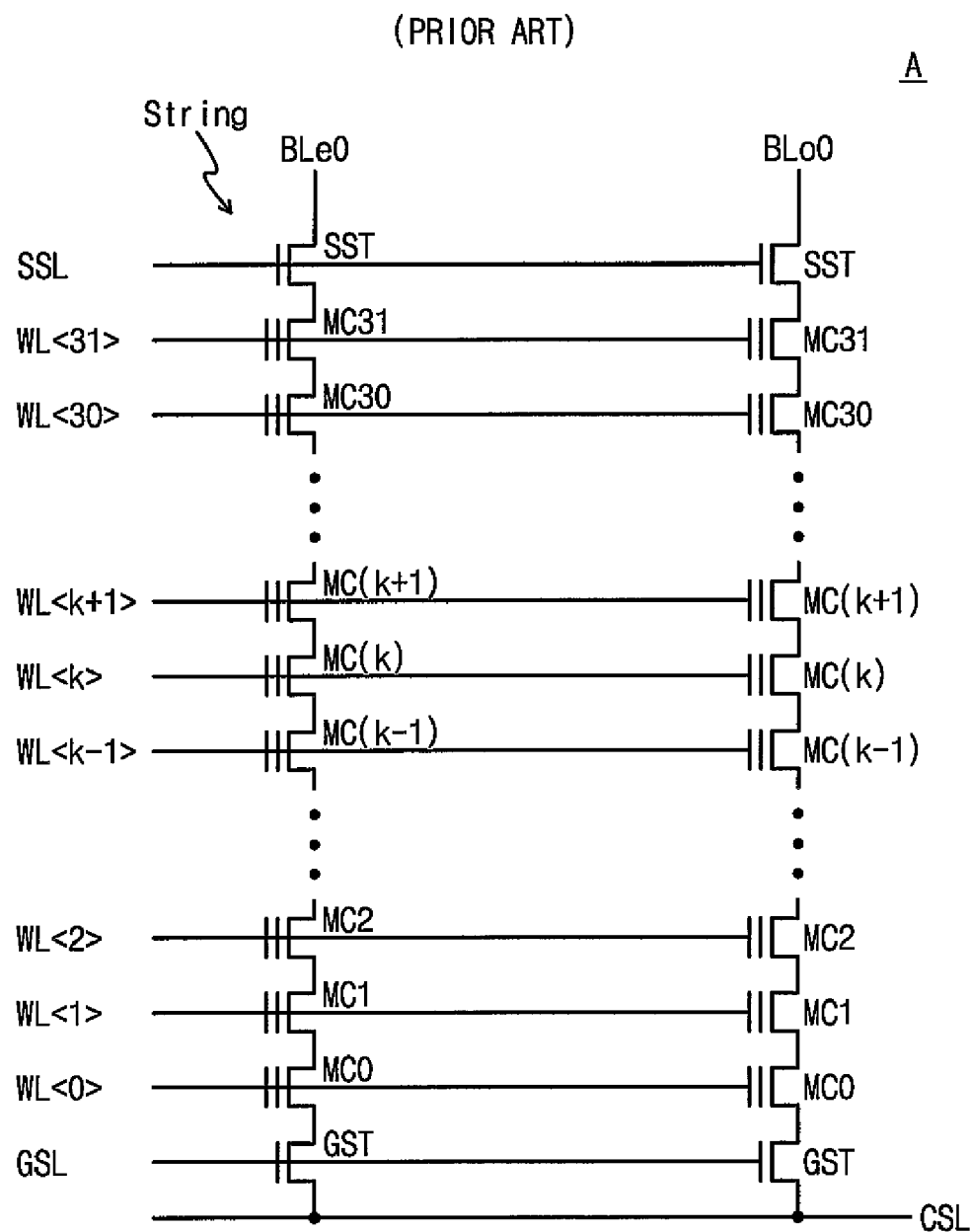
FIG. 2 is a circuit diagram showing a part of an array illustrated in FIG. 1.

The present invention will now be described with reference to several embodiments illustrated in the accompanying drawings. The invention may, however, be variously embodied and should not be construed as being limited to only the illustrated embodiments. Rather, the illustrated embodiments are presented as teaching examples. In the drawings, like reference numbers and labels indicate like or similar elements.

In one aspect, the illustrated embodiments of the invention provide a method and flash memory configuration capable of reducing peak consumption current during multiple speed operations of the flash memory device.

Figure 4:
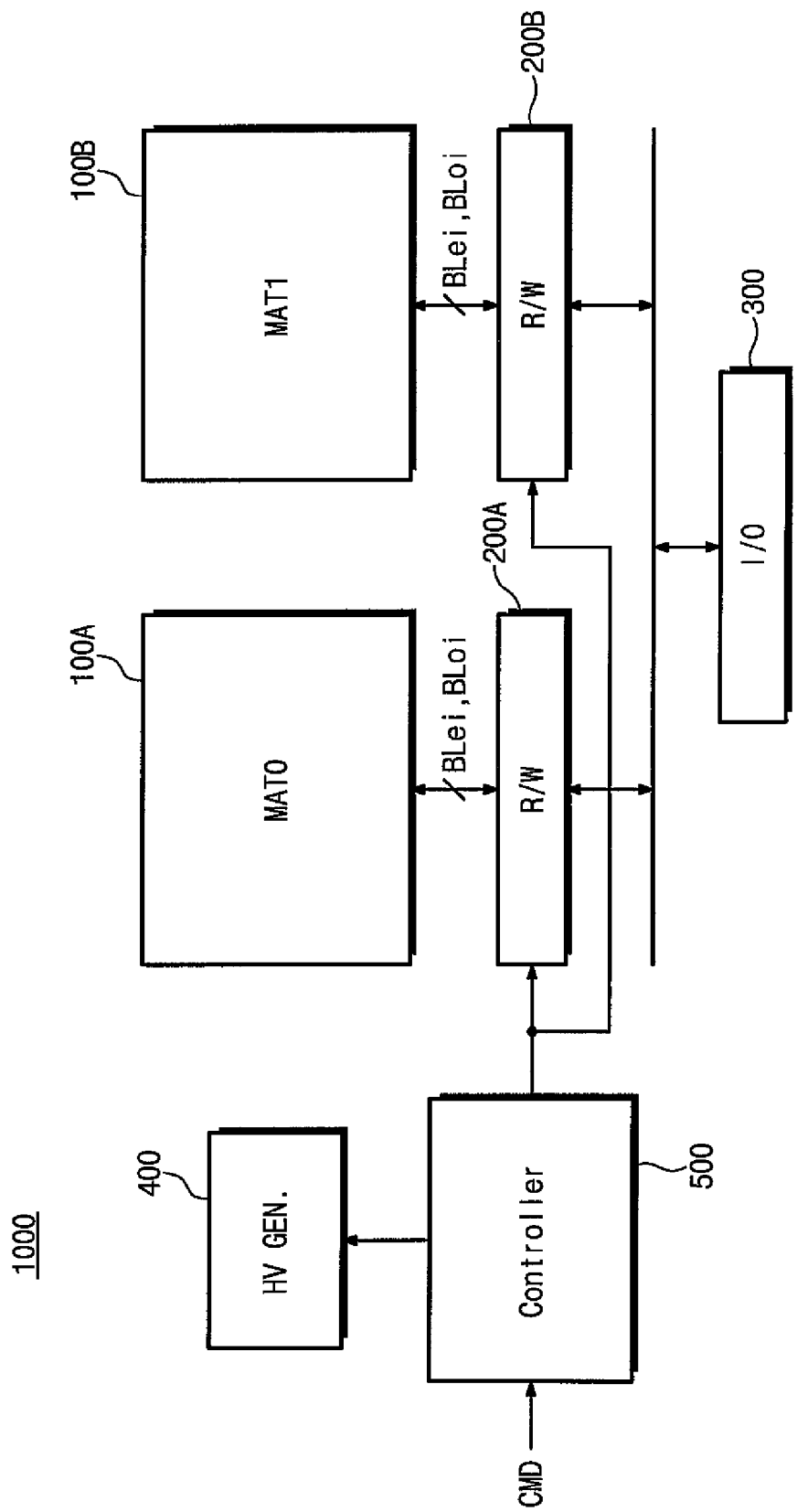
FIG. 4 is a block diagram of an exemplary flash memory device according to an embodiment of the invention.

FIG. 4 is a block diagram of an exemplary flash memory device according to one embodiment of the invention.

Referring to FIG. 4, a flash memory device 1000 according to an embodiment of the invention comprises a memory cell array including a plurality of memory cells each capable of storing N bits of data, where N is an integer greater than 0. The illustrated memory cell array has been divided into two "mats" 100A and 100B (i.e., the number of mats "M" in the illustrated example is two). Other divisions of a memory cell array may be made according to the overall design of the flash memory device. It is assumed for purposes of this description that mats 100A and 100B are substantially identical in their configuration and operation, and may be conventionally configured in large measure pursuant to the description given in relation to FIG. 1, except for the features described hereafter.

Flash memory device 1000 also comprises first and second read/write circuits 200A and 200B, an input/output (I/O) interface 300, a high voltage generator circuit 400, and a controller 500. First and second read/write circuits 200A and 200B are controlled by controller 500 and generally perform read and write operations in relation to data stored in corresponding mats 100A and 100B, respectively. Although not shown in FIG. 4, each of first and second read/write circuits 200A and 200B may include one or more conventionally understood page buffers, row and column decoder circuits, etc. The page buffers in each of first and second read/write circuits 200A and 200B may be configured similar to the structure illustrated in FIG. 1. That is, each page buffer contained within first and second read/write circuits 200A and 200B may be associated with paired even/odd bit lines.

In the illustrated embodiment, the transfer of data to/from each one of first and second read/write circuits 200A and 200B occurs through I/O interface 300 under the control of controller 500. Operation of high voltage generator circuit 400 may be conventionally controlled by controller 500 to generate the voltages required by the constituent operating modes of flash memory device 1000, such as a program voltage, a pass voltage, an erase voltage, etc.

In a conventional manner, controller 500 will control the overall operation of flash memory device 1000 in response to one or more externally provided commands (e.g., commands from a memory controller or a host device controller). In particular, controller 500 will control the operation of first and second read/write circuits 200A and 200B based on whether a received command related to a program operation indicates a single speed operating mode or a double speed operating mode.

Figure 3:
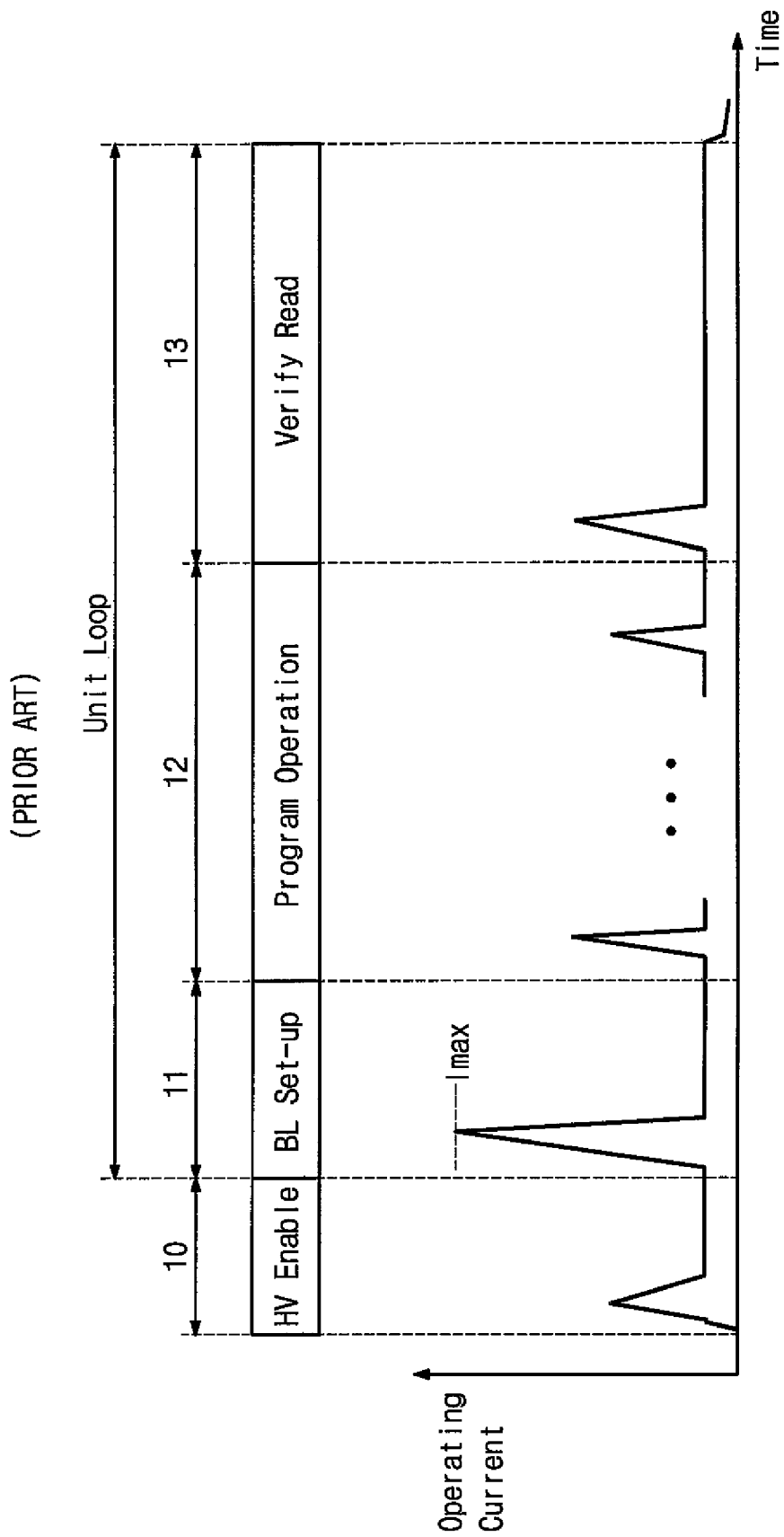
FIG. 3 is a diagram showing power consumption within each interval of a program operation of a conventional flash memory device illustrated in FIG. 1.

For example, in a case where a single speed operating mode command is received, controller 500 will conventionally control one of the first and second read/write circuits 200A and 200B in the same manner similar to that described with respect to FIG. 3. However, where a double speed operating mode command is received, controller 500 will control both first and second read/write circuits 200A and 200B such that the pre-charging of the respective bit lines for each mat 100A and 100B is performed in a time division approach (i.e., an interval division approach). This operation will be described hereafter in some additional detail. Accordingly, it is possible to reduce peak current by pre-charging bit lines in each mat using a time division approach.

FIG. 5 is a diagram further describing the time division approach taken with respect to the bit line setup interval of a program operation for a flash memory device according to an embodiment of the invention. Within FIG. 5, intervals 201, 202, 203, and 204 generally correspond to intervals 10, 11, 12, and 13 previously described.

However, when an externally provided program command is received, controller 500 determines whether it indicates a single speed program operation (hereinafter, referred to as "a normal program operation) or a double speed program operation (hereinafter, referred to as "a double speed program operation). If the received program command indicates a normal program operation, controller 500 controls either one of first and second read/write circuits 200A and 200B to perform a program operation with respect to a corresponding mat. In this case, the program operation may be made in the same manner as described in FIG. 3, and description thereof is thus omitted. If the received program command indicates a double speed program operation, controller 500 controls both first and second read/write circuits 200A and 200B according to the following time division approach.

As illustrated in FIG. 5, during the bit line setup interval following the high voltage enable interval, a bit line setup operation is conducted with respect to mats 100A and 100B, respectively. For example, controller 500 may control the first read/write circuits (i.e., page buffers) so as to pre-charge all bit lines in the first mat 100A with a pre-charge voltage. After a time "dT" elapses, controller 500 then controls the second read/write circuits (i.e., page buffers) so as to pre-charge all bit lines in the second mat 100B with a pre-charge voltage. After the pre-charge operation is complete with respect to both mats, one bit line in each pair of bits lines for each mat may be set to a program voltage or a program-inhibit voltage based on the data to be written into memory. Afterward, like the above description, program execution and verify read operations for the respective mats 100A and 100B may be simultaneously carried out. A unit loop consisting of intervals 202, 203 and 204 may be repeated, subject to a determination of normally programmed data or a defined maximum loop number.

As described above, the bit line setup interval for first and second mats 100A and 100B is divided in order to reduce the peak current consumption during a double speed program operation. Assuming that a time needed for the bit line setup interval is about 5 ms, it takes about 1.5 μs to accomplish the time division approach. Of note, the time required to perform the time division approach is a very small part of the overall time required for a conventional unit program loop time of about 50 μs. Assuming that a page program operation is completed through four program loops, it takes about 200 μs (4*50 μs) to complete a program operation without use of the time division approach. On the other hand, by using the time division approach, it takes a time of 206 μs (200 μs+4*1.5 μs) to complete a program operation. That is, a total program time overhead is increased by only about 3%. The above-described time division approach has been described in relation to a double speed program operation. However, it is possible to apply the above-described time division approach to three or more operating modes having different speeds.

In the illustrated embodiment, the bit line setup interval is a preparatory interval for programming as a first operation interval, and a program execution interval is an interval where an actual program operation is carried out, as a second operation interval. Since peak current is consumed in the first operation interval, it is preferable to prevent maximum current consumption by forcing a peak current consumption interval for first mat 100A during a different time period from that of second mat 100B.

FIG. 6 is a diagram describing another time division approach to a bit line setup interval for a program operation for a flash memory device according to an embodiment of the invention.

Intervals 301, 303, and 304 of FIG. 6 correspond to intervals 201, 203 and 204 of FIG. 5, respectively, and a description thereof is thus omitted. However, the bit line setup interval of FIG. 6 is different from that of FIG. 5 in that a time division approach is applied with respect to bit lines in the respective mats. Thus, it is assumed that the bit lines in each of first and second mats 100A and 100B have been divided into at least two groups. According to this assumption, the first group of bit lines in the respective mats 100A and 100B is pre-charged, and then the second group of bit lines in the respective mats 100A and 100B is pre-charged. For example, as illustrated in FIG. 6, a sequence may be configured such that 2 Kbyte bit lines in each mat are divided by 1 Kbyte and that a bit line setup operation is partially overlapped with respect to divided bit lines. That is, a first page and a second page are processed in the same sequence. But, it is possible to divide 2 Kbyte bit lines in each page by 1 Kbyte. This partial interval overlapping approach enables peak current consumption intervals to be sequentially phased.

The above-described time division approach may be utilized to reduce (e.g. stagger) peak current with respect to at least one interval of a program/erase operation. Furthermore, it is possible to utilize a mat or bank division approach so long as the approach in not a block division approach.

Although the present invention has been described in connection with selected embodiments, it is not limited thereto. It will be apparent to those skilled in the art that various substitution, modifications and changes may be thereto without departing from the scope of the invention.

What is claimed is:
1. A method of operating a flash memory device including first and second mats, each one of the first and second mats including a plurality of bit lines connecting a plurality of memory cells, the method comprising:
    precharging the plurality of bit lines in the first mat during a first bit line set-up interval of a set-up interval;
    precharging the plurality of bit lines in the second mat during a second bit line set-up interval of the set-up interval, wherein the first bit line set-up interval and the second bit line set-up interval begin at different times during the set-up interval; and simultaneously beginning programming of the plurality of memory cells for the first and second mats during a programming execution interval following the set-up interval.

2. The method of claim 1, wherein the programming of the plurality of memory cells for the first and second mats ends at substantially the same time.

3. A method of operating a flash memory device in a first operating mode and a second operating mode having different operating speeds, wherein each one of the first and second operating modes comprises a bit line set-up interval and at least one additional interval, wherein the flash memory is divided into first and second mats connected to respective first and second read/write (R/W) circuits and the method comprises:

during the bit line set-up interval of the second operating mode, controlling operation of both the first and second R/W circuits in a time division approach to stagger respective peak current intervals for the first and second mats, and during the at least one additional interval of the second operating mode, controlling the first and second R/W circuits to operate simultaneously, wherein the at least one additional interval comprises a program operation interval following the bit line set-up interval.

4. The method of claim 3, wherein the second operating mode is a double speed operation.

5. The method of claim 3, wherein the at least one additional interval further comprises a program verify/read interval following the program operation interval.

6. The method of claim 3, wherein the at least one additional interval is a high voltage enable interval preceding the bit line set-up interval.

7. The method of claim 6, further comprising generating a high voltage required during the high voltage enable interval.

* * * * *